(12) United States Patent
de Boer et al.

(10) Patent No.: US 9,261,800 B2
(45) Date of Patent: Feb. 16, 2016

(54) ALIGNMENT OF AN INTERFEROMETER MODULE FOR USE IN AN EXPOSURE TOOL

(75) Inventors: Guido de Boer, Leerdam (NL); Thomas Adriaan Ooms, Delfgauw (NL); Niels Vergeer, Rotterdam (NL); Godefridus Cornelius Antonius Couweleers, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 561 days.

(21) Appl. No.: 13/436,741

(22) Filed: Mar. 30, 2012

(65) Prior Publication Data

US 2012/0250030 A1 Oct. 4, 2012

(30) Foreign Application Priority Data

Mar. 30, 2011 (NL) ...................................... 2006496

(51) Int. Cl.
*G01B 11/02* (2006.01)
*G03F 7/20* (2006.01)

(52) U.S. Cl.
CPC .......... *G03F 7/70775* (2013.01); *G03F 7/7085* (2013.01); *G03F 7/70833* (2013.01); *H01J 2237/30438* (2013.01)

(58) Field of Classification Search
CPC ............ G03F 7/70775; G03F 7/70833; G03F 7/7085; H01J 2237/30438
USPC ........................................................ 356/508
See application file for complete search history.

(56) References Cited

U.S. PATENT DOCUMENTS

| 4,504,147 | A | * | 3/1985 | Huang ........................... 356/510 |
| 5,719,702 | A | | 2/1998 | Decker |
| 5,745,242 | A | | 4/1998 | Hata |
| 5,880,838 | A | | 3/1999 | Marx et al. ..................... 356/498 |
| 5,949,546 | A | | 9/1999 | Lee et al. |
| 6,020,963 | A | | 2/2000 | DiMarzio |
| 6,122,036 | A | | 9/2000 | Yamasaki et al. |
| 6,266,130 | B1 | | 7/2001 | Hasegawa et al. |
| 6,331,885 | B1 | | 12/2001 | Nishi |
| 6,486,955 | B1 | | 11/2002 | Nishi |
| 6,507,326 | B2 | | 1/2003 | Manabe et al. |

(Continued)

FOREIGN PATENT DOCUMENTS

| CN | 1916561 | 2/2007 |
| DE | 102004023030 A | 12/2005 |

(Continued)

OTHER PUBLICATIONS

Agilent, Lasers and Optics: User's Manual, vol. 1, Pub Sep. 2007.*

(Continued)

*Primary Examiner* — Tarifur Chowdhury
*Assistant Examiner* — Jonathon Cook
(74) *Attorney, Agent, or Firm* — Blakely Sokoloff Taylor & Zafman LLP

(57) ABSTRACT

The invention relates to alignment of an interferometer module for use in an exposure tool. An alignment method is provided for aligning an interferometer to the tool while outside of the too. Furthermore, the invention provides a dual interferometer module, an alignment frame use in the alignment method, and an exposure tool provided with first mounting surfaces for cooperative engagement with second mounting surfaces of an interferometer module.

18 Claims, 17 Drawing Sheets

(56) References Cited

U.S. PATENT DOCUMENTS

| | | | |
|---|---|---|---|
| 6,563,573 B1 | 5/2003 | Morohoshi et al. | |
| 7,224,466 B2 | 5/2007 | Ray | |
| 7,298,492 B2 | 11/2007 | Tixier | 356/491 |
| 7,397,570 B2 | 7/2008 | Kawasaki et al. | 356/512 |
| 7,413,310 B2 | 8/2008 | Heine | |
| 7,528,960 B2 | 5/2009 | Boesser et al. | 356/500 |
| 7,897,942 B1 | 3/2011 | Bareket et al. | |
| 8,462,349 B1 | 6/2013 | Rhoadarmer et al. | 356/491 |
| 2003/0007158 A1 | 1/2003 | Hill | 356/493 |
| 2004/0150831 A1 | 8/2004 | Ray | |
| 2005/0105855 A1 | 5/2005 | Dressler | |
| 2005/0225770 A1 | 10/2005 | Chapman et al. | |
| 2007/0041022 A1 | 2/2007 | Schluchter | |
| 2007/0229841 A1 | 10/2007 | Feldman | |
| 2008/0198386 A1 | 8/2008 | Hirata et al. | 356/491 |
| 2009/0135430 A1 | 5/2009 | Zhu | 356/487 |
| 2010/0183987 A1 | 7/2010 | Yonekawa | |
| 2012/0249984 A1 | 10/2012 | de Boer et al. | |
| 2012/0250026 A1 | 10/2012 | de Boer et al. | |
| 2012/0250030 A1 | 10/2012 | de Boer et al. | |

FOREIGN PATENT DOCUMENTS

| | | |
|---|---|---|
| EP | 1174679 A2 | 1/2002 |
| EP | 0956518 B1 | 1/2004 |
| EP | 0999475 B1 | 1/2008 |
| JP | 1184402 | 7/1989 |
| JP | 07253303 | 10/1995 |
| JP | 2005057222 | 3/2005 |
| JP | 2006170796 | 6/2006 |
| WO | WO03033199 A1 | 4/2003 |
| WO | 03067334 A | 8/2003 |
| WO | WO-2012134290 A1 | 10/2012 |

OTHER PUBLICATIONS

Harris, et al. "Stage Position Measurement for e-beam Lithography Tool." Proc. SPIE 6517, Emerging Lithographic Technologies XI, 651710 (Mar. 15, 2007). 10 pages.

Magnan, Pierre. "Detection of Visible Photons in CCD and CMOS: A Comparative View." Nuclear Instruments and Methods in Physics Research A 504 (2003), p. 199-212. 14 pages.

"RLD10 DI (Differential Interferometer) Detector Head." L-9904-2351-04-A Data Sheet, Renishaw (2010). www.renishaw.com. 2 pages.

Chapman, M., "Heterodyne and homodyne interferometry", Renishaw 2002.

Midgley, J.A. et al, "High-resolution laser homodyne interferometer", Electronics Letters, Mar. 25, 1971, vol. 7, No. 5/6.

Lee, W., "Recent developments in homodyne interferometry", Renishaw, Oct. 27, 2004.

Schattenberg, M. et al, "Metrology for the sub-100 nm domain via fiducial grids", MIT, Cambridge 2003.

Dobosz, M. et al, "Interference detection system for distance measuring interferometer", Optics & Laser Technology 44 (2012), 1620-1628, available online Dec. 20, 2011.

Steila, O. et al, "Automatic In-phase Quadrature Balancing AIQB".

Steila, O. et al, "Automatic In-phase Quadrature Balancing AIQB," Oct. 2006.

Non-Final Office Action in U.S. Appl. No. 13/436,736 dated Jul. 1, 2015. 7 pages.

Non-Final Office Action in U.S. Appl. No. 14/716,801 dated Jul. 7, 2015. 16 pages.

Search Report and Written Opinion of the Isa in PCT Application No. PCT/NL2013/050691 dated Feb. 24, 2014. 9 pages.

Chinese Office Action with English Language Translation, dated Nov. 3, 2015, Chinese Application No. 201210091968.0.

\* cited by examiner

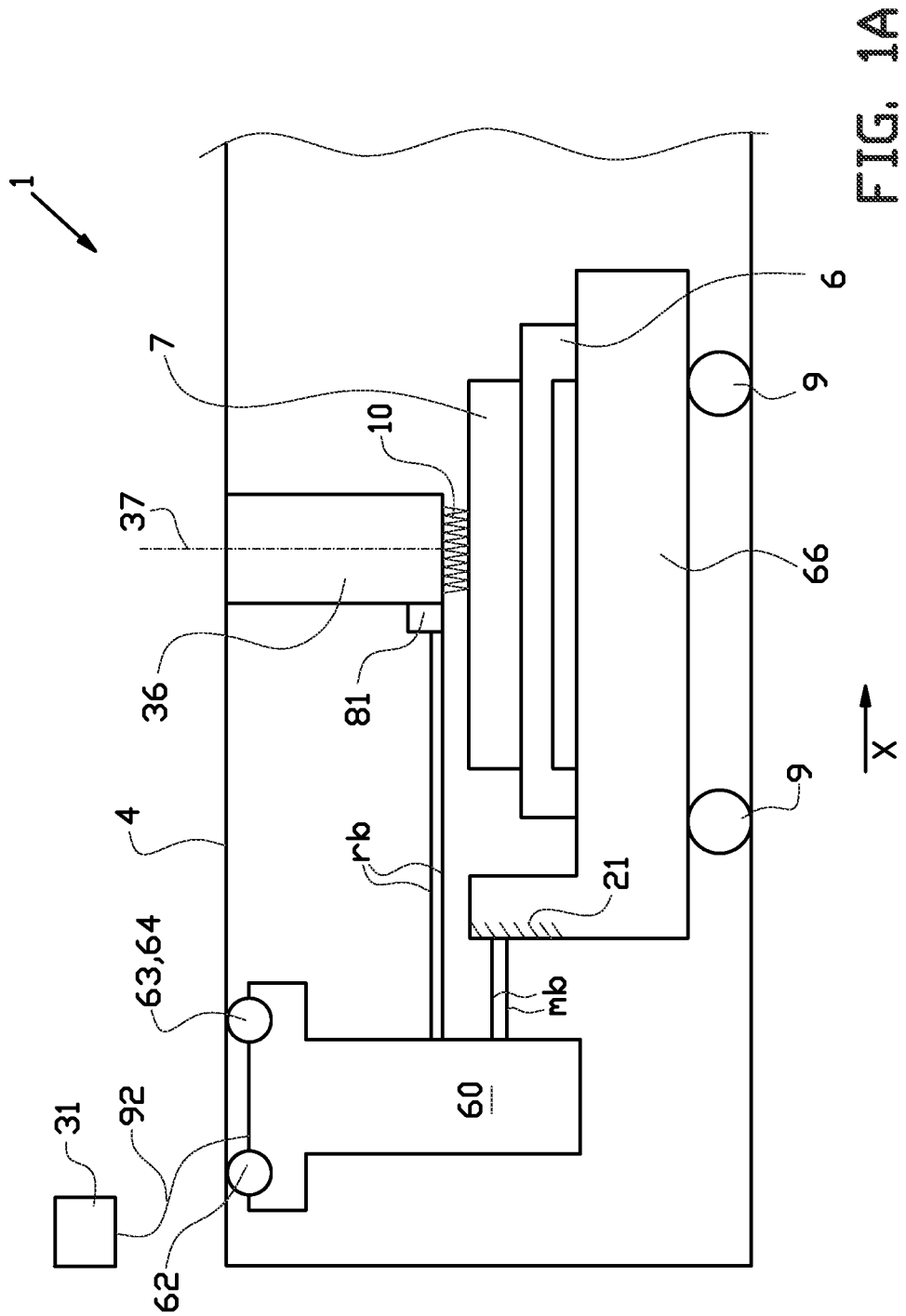

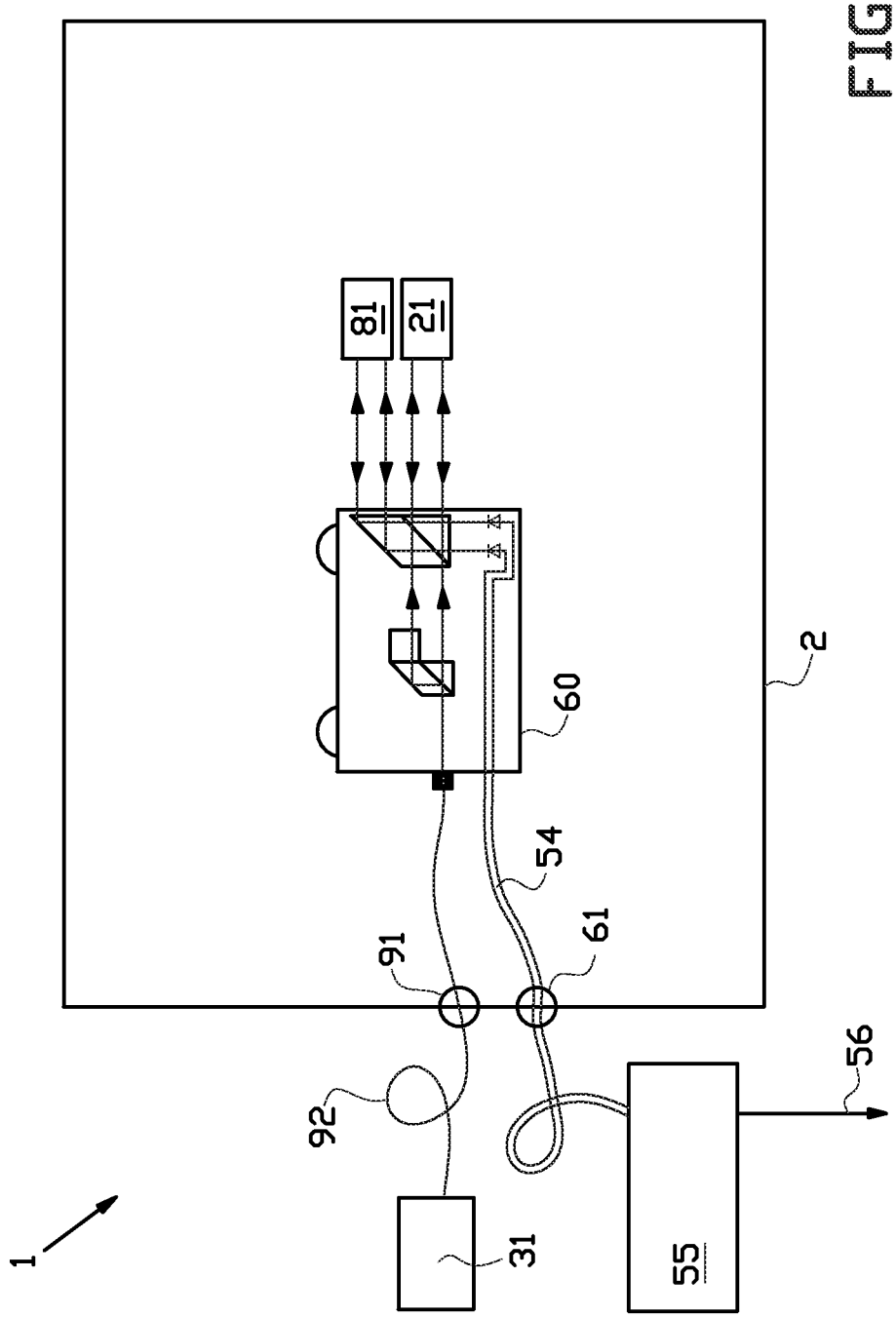

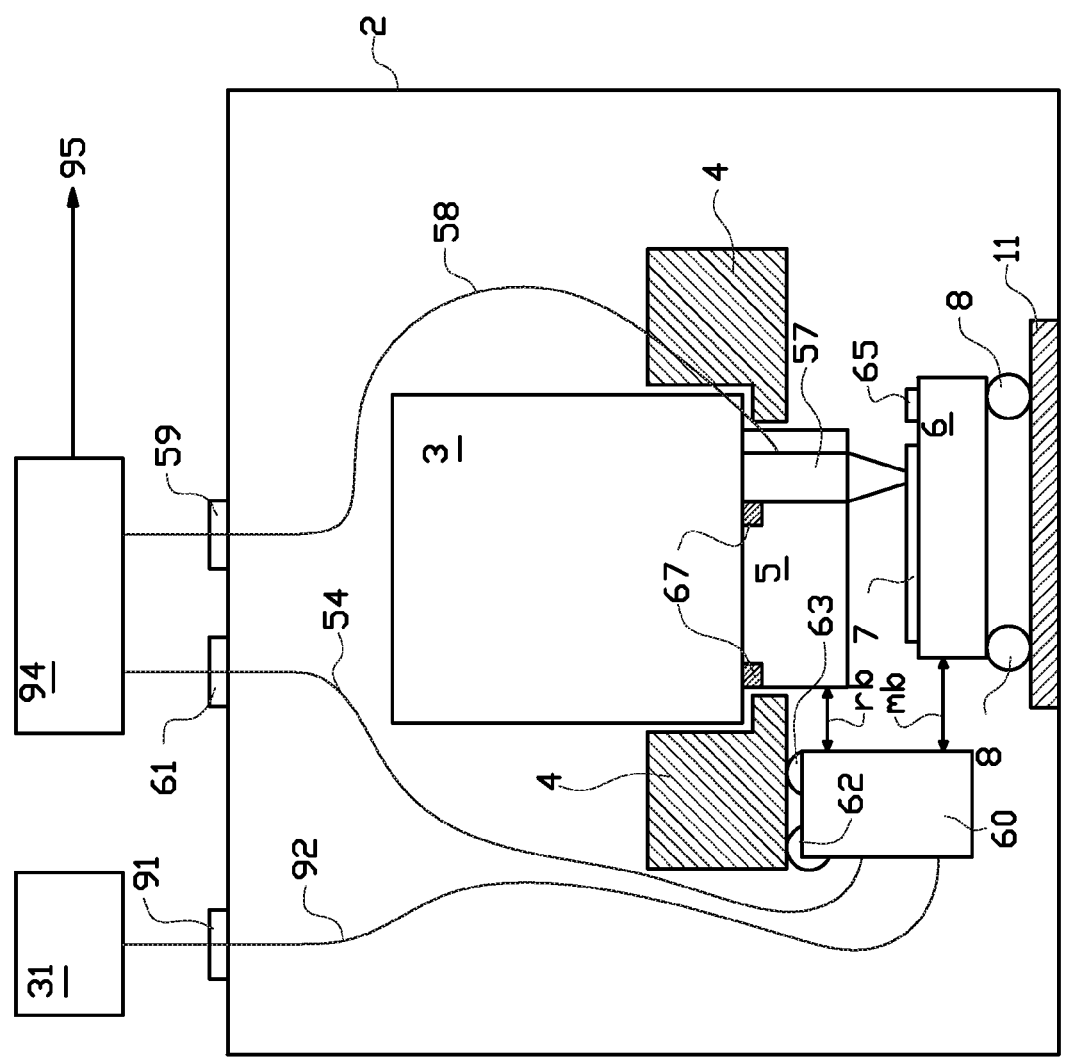

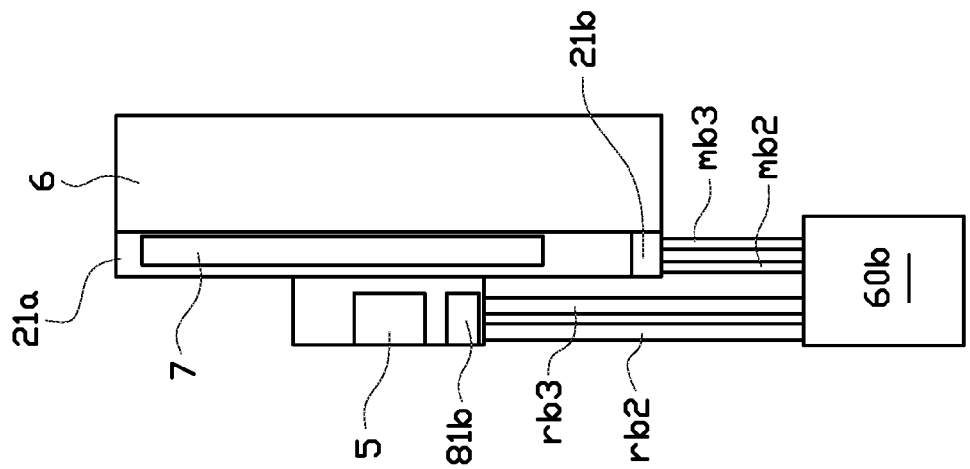
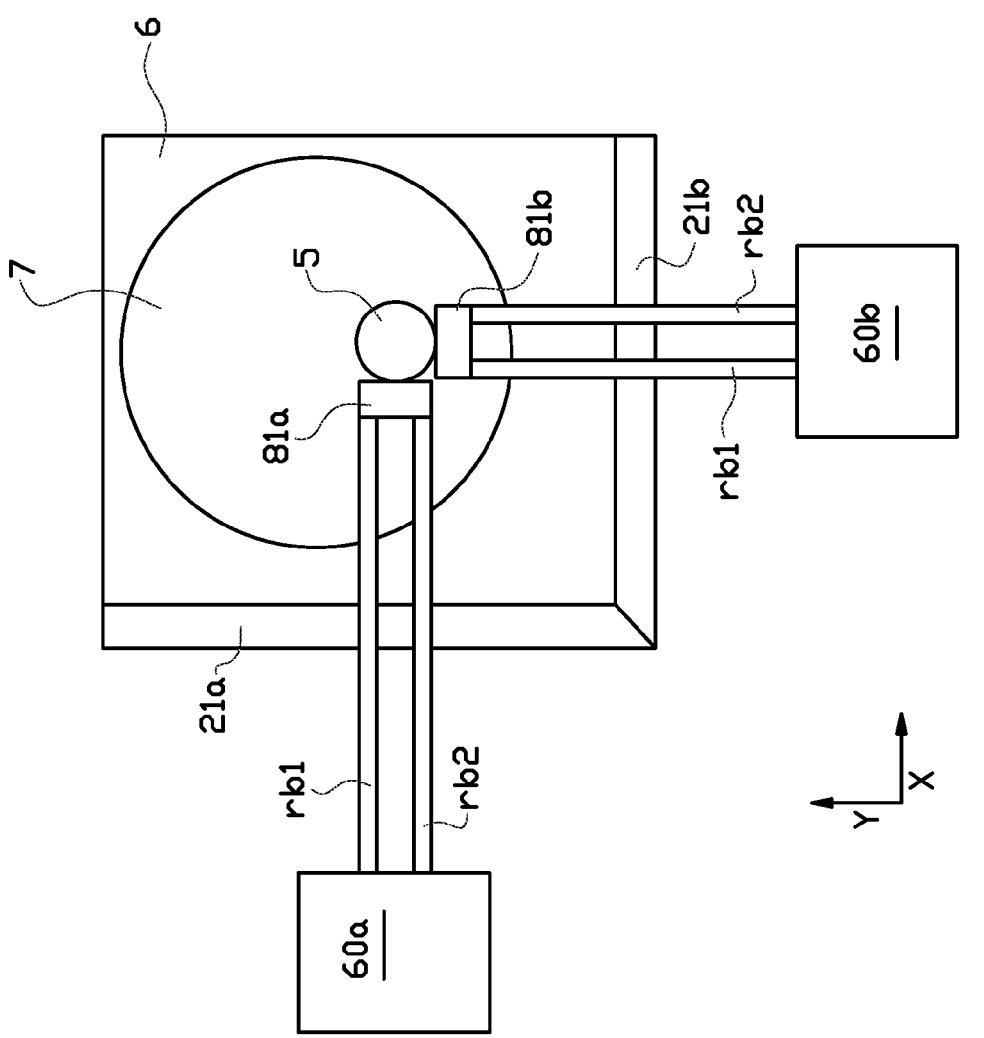

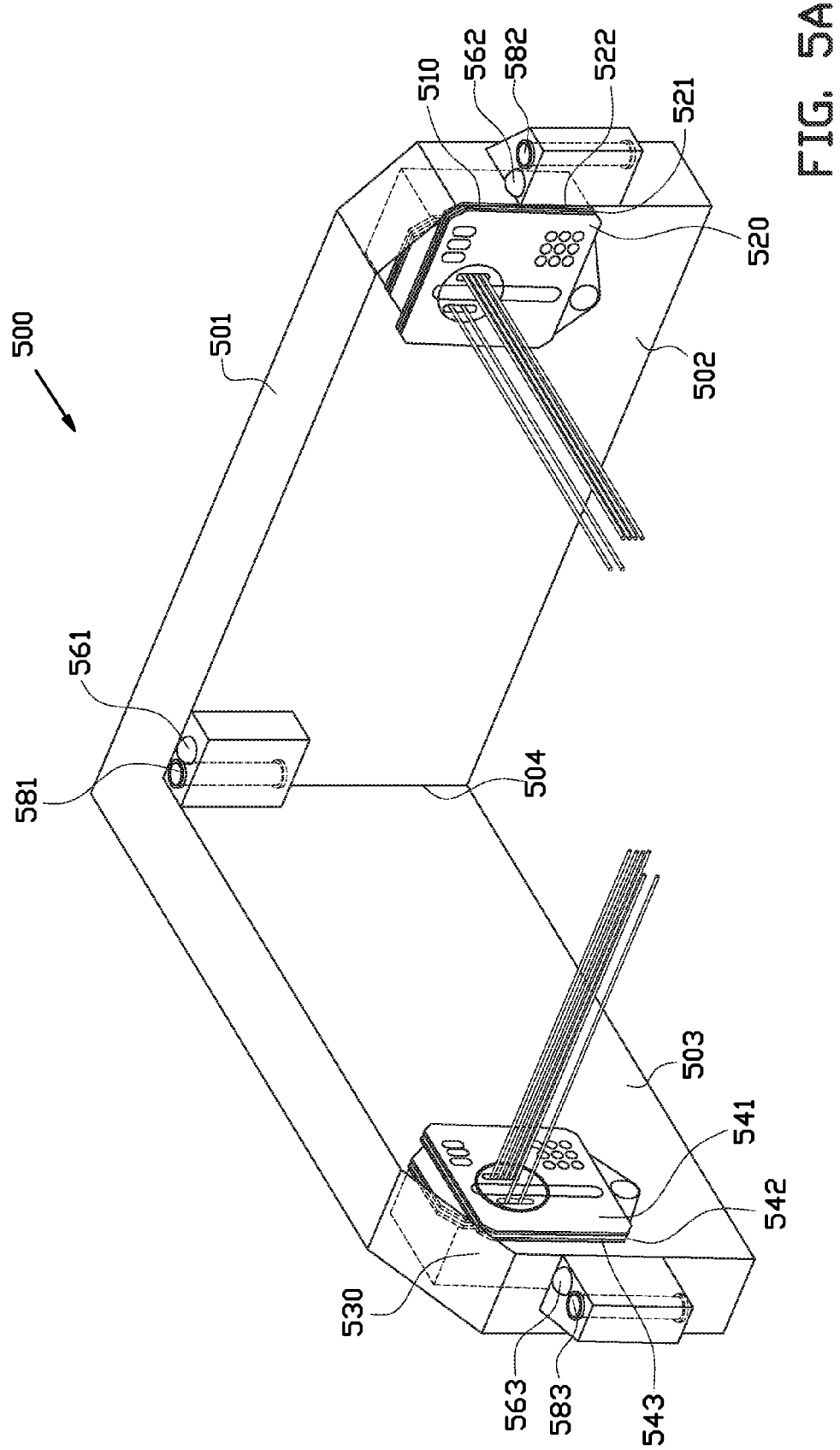

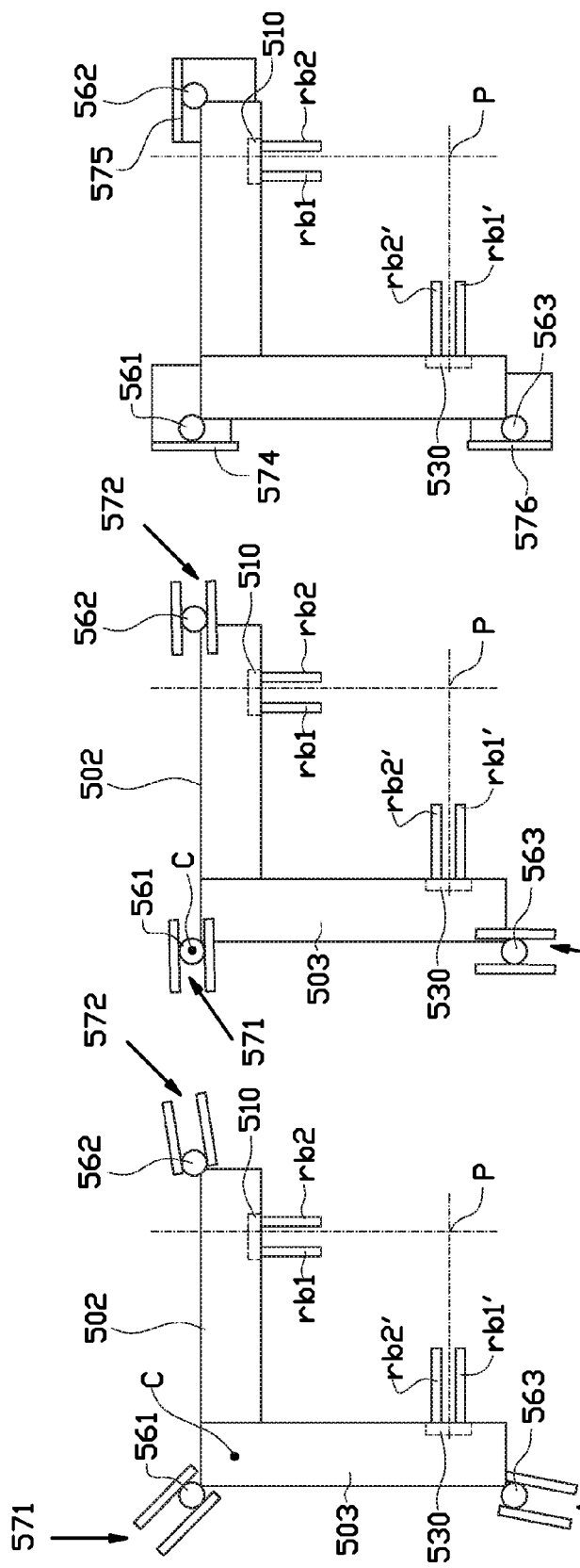

ALIGNMENT OF AN INTERFEROMETER MODULE FOR USE IN AN EXPOSURE TOOL

BACKGROUND

The invention relates to alignment of an interferometer module for use in an exposure tool. Exposure tools comprising an optical column and a target carrier for carrying a target to be exposed and for moving said target relative to said optical column, often comprise an interferometer for accurately determining the position of the target within the exposure tool. In order to work properly, such an interferometer must be aligned with other parts of the exposure tool, e.g. with a mirror on said target carrier and/or a mirror on said optical column. When replacing the interferometer, for instance for performing maintenance thereon or for upgrading the tool, the replacement interferometer must be aligned relative to said exposure tool, in particular relative to the mirrors in the tool onto which the interferometer emits its beams. The time required for such an alignment procedure increases the downtime of the exposure tool when replacing an interferometer.

It is an object of the invention to provide an interferometer module, method and exposure tool for reducing downtime during replacement of the interferometer in the exposure tool.

SUMMARY OF THE INVENTION

According to a first aspect, the present invention provides a method for pre-aligning an interferometer module for use in an exposure tool, said tool comprising a frame provided with first mounting surfaces and a mirror for reflecting an interferometer beam, wherein said module comprises an interferometer head for emitting an interferometer beam, and wherein said module is connected to second mounting surfaces for cooperative engagement with said first mounting surfaces, said method comprising aligning the orientation of said module relative to said second mounting surfaces outside of said exposure tool, wherein said orientation of said module relative to said second mounting surfaces is aligned based on a pre-determined orientation of said first mounting surface relative to said mirror. Such a predetermined orientation may comprise an angular orientation and/or a positional orientation of said first mounting surfaces relative to said mirror. As the interferometer is pre-aligned outside of the exposure tool, it is no longer necessary to align a replacement interferometer once it is mounted in the exposure tool. As a result, the downtime of the exposure tool is significantly reduced. Typically, the second mounting surfaces of the module comprise three separate mounting surfaces, and the first mounting surfaces of the exposure tool comprise a corresponding number of separate mounting surfaces.

In an embodiment said method further comprises a step of mounting said aligned module in said exposure tool. Typically, this method is performed when replacing an interferometer module mounted in a tool with a replacement module; first the replacement module is aligned while the other module is still mounted in the exposure tool, and then, after the replacement module has been aligned the other module is removed from the tool and the aligned module is mounted in the tool. The tool can then continue operation without having to further align the replacement module in the tool.

In an embodiment said aligning comprises: providing an alignment frame spaced apart from said exposure tool, said frame comprising third mounting surfaces for cooperative engagement with said second mounting surfaces, and a sensor for sensing whether a beam emitted by said interferometer head is emitted to a pre-determined position, said aligning further comprising mounting said module with said second mounting surfaces on said third mounting surfaces of said alignment frame, emitting a beam with said interferometer head, and adjusting the orientation of said module relative to said second mounting surfaces to position said beam on said pre-determined position.

In an embodiment the method further comprises using a knife-edge arranged for partially blocking said beam from reaching said sensor when said module is mounted in said alignment frame, wherein said step of adjusting comprises determining that said beam is in said predetermined position when the energy of said beam sensed by said sensor is substantially equal to a predetermined fraction of a total beam energy of said beam. The predetermined fraction is preferably 50% of the total beam energy of said beam. This method allows the use of simple light sensors, such as photodiodes to accurately determine whether the beam is in said predetermined position. The position of the knife edge relative to the sensor and relative to the third mounting surfaces is preferably known.

In an embodiment said interferometer is a differential interferometer adapted for emitting said beam as a measurement beam and for emitting a corresponding reference beam, wherein said alignment frame comprises an sensor for sensing the position of said reference beam, said method comprising adjusting the orientation of said module relative to the direction into which said measurement and reference beams are emitted such that the sum of energy of said beams sensed by said beam sensing surfaces is substantially equal to a predetermined fraction of a total beam energy of said beams. This method allows aligning a differential interferometer such that a maximum measured energy of a combined beam formed from a reference beam and a corresponding measurement beam is optimized.

In an embodiment said predetermined fraction is substantially 50%.

In an embodiment said first mounting surfaces of said exposure tool and/or said third mounting surfaces of said alignment frame are adapted for forming a kinematic mount with said second mounting surfaces of said interferometer module. A mount is said to be kinematic when the number of degrees of freedom (axes of free motion) and the number physical constraints applied to the mount total six. For instance, the interferometer module might be provided with three kinematic balls, and the exposure tool might comprise an interface plate 81 facing the interferometer module and provided with a "cone, groove, and flat" first mounting surfaces, as for instance shown in FIG. 10A of International patent application WO 2010/021543, included herein by reference.

In an embodiment said module comprises a further interferometer head arranged for emitting a further beam substantially perpendicular to said beam, wherein said aligning further comprises:

aligning the orientation of said further interferometer head relative to said second mounting surfaces outside of said exposure tool based on a pre-determined orientation of said first mounting surfaces, wherein the orientations of said interferometer head and said further interferometer head are adjusted such that said beams emitted by said interferometer head and said further interferometer head are inclined at a substantially pre-determined angle to each other.

In an embodiment said predetermined angle is 90 degrees.

In an embodiment said aligning comprises aligning said beam and said further beam such that they intersect.

According to a second aspect, the present invention provides an exposure tool comprising: projection optics for projecting one or more exposure beams onto a target, a target positioning system comprising a target carrier adapted for moving said target relative to said projection optics, wherein said target carrier is provided with a mirror, first mounting surfaces having a substantially pre-determined orientation, an interferometer module adapted for measuring a displacement of said target within said tool, said interferometer module comprising second mounting surfaces adapted for cooperative engagement with said first mounting surfaces, wherein said target positioning system is adapted for moving said target based on said measured displacement, wherein said exposure tool and interferometer module are adapted for releasably mounting said second mounting surfaces of said interferometer module on said first mounting surfaces of said exposure tool such that said second mounting surfaces are aligned relative to said first mounting surfaces.

Preferably the exposure tool is provided with an interferometer module aligned according to the method described herein.

In an embodiment said exposure tool further comprises releasable clamping means for releasably clamping said second mounting surfaces of said interferometer module against said first mounting surfaces. The clamping means preferably comprise quick-release clamping means.

In an embodiment said releasable clamping means comprises a leaf-spring adapted for biasing said second mounting surfaces against said first mounting surfaces.

In an embodiment wherein said exposure tool comprises an accommodating section for receiving said interferometer module, wherein said accommodating section comprising said first mounting surfaces.

In an embodiment said accommodating section comprises a wall provided with a passage for allowing a beam emitted by said interferometer to pass through.

In an embodiment said first mounting surfaces comprise three spaced apart planar abutment surfaces for abutting said second mounting surfaces, wherein said planes of said abutment surfaces intersect at a position having a distance to said projection optics which is substantially greater than a distance of said interferometer head to said projection optics along the direction of the beam emitted by said interferometer head.

In an embodiment said first mounting surfaces comprise grooves extending parallel to said abutment surfaces.

According to a third aspect the present invention provides an interferometer module for use in an exposure tool described herein, said interferometer module comprising an interferometer head for emitting a beam, second mounting surfaces for cooperative engagement with said first mounting surfaces of said exposure tool, and adjustment means for adjusting an orientation of said interferometer head relative to said second mounting surfaces.

In an embodiment said interferometer head is a first interferometer head, said module further comprising a second interferometer head arranged for emitting a beam substantially perpendicular to a beam emitted by said first interferometer head, and second adjustment means for adjusting an orientation of said second interferometer head relative to said second mounting surfaces.

In an embodiment said interferometer module is substantially L-shaped, with said first and second interferometer head each arranged on different legs of said L-shaped module for emitting a beam towards each other.

In an embodiment said second mounting surfaces are arranged at corners of said L-shaped module.

In an embodiment wherein said adjustment means comprise a number of adjustment plates.

According to a fourth aspect the present invention provides an alignment frame for pre-alignment of an interferometer module, wherein said module comprises an interferometer head for emitting a beam, second mounting surfaces for cooperative engagement with first mounting surfaces of an exposure tool spaced apart from said alignment frame, said alignment frame comprising third mounting surfaces for cooperative engagement with said second mounting surfaces and a sensor for sensing a position of a beam emitted by said interferometer head.

In an embodiment said third mounting surfaces are adapted to form a kinematic mount with said second mounting surfaces.

In an embodiment said sensor is arranged for having said emitted beam directly incident thereon when said second mounting surfaces are engaging said third mounting surfaces.

In an embodiment said sensor is arranged at a predetermined position relative to said third mounting surfaces.

In an embodiment said sensor comprises a beam sensing surface for sensing a beam incident thereon.

In an embodiment said alignment frame further comprises a knife-edge arranged between said module and said beam sensing surface and proximate to said beam sensing surface.

In an embodiment said beam sensing surface is greater than or equal to the area of a perpendicular cross-section of said beam.

In an embodiment said alignment frame further comprises one or more additional sensors spaced apart from said sensor and adapted for sensing positions of one or more additional beam spots of one or more additional beams emitted by said interferometer module.

In summary, the invention relates to alignment of an interferometer module for use in an exposure tool. An alignment method is provided for aligning an interferometer to the tool while outside of the too. Furthermore, the invention provides a dual interferometer module, an alignment frame use in the alignment method described herein, and an exposure tool provided with first mounting surfaces for cooperative engagement with second mounting surfaces of an interferometer module which has been pre-aligned.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIGS. 1A and 1B show schematic side views of a lithography system according to the present invention, FIG. 1C shows a schematic side view of a further embodiment of a lithography system according to the present invention, FIGS. 4A and 4B show a top view and a side view respectively of a lithography system comprising two interferometer modules according to the present invention, FIGS. 5A and 5B show a perspective view of a dual-interferometer module and a single interferometer head thereof respectively, according to the invention, FIGS. 7A, 7B, and 7C show alternative configurations of the first mounting surfaces of an exposure tool according to the present invention.

DETAILED DESCRIPTION OF THE INVENTION

Figure 2A:
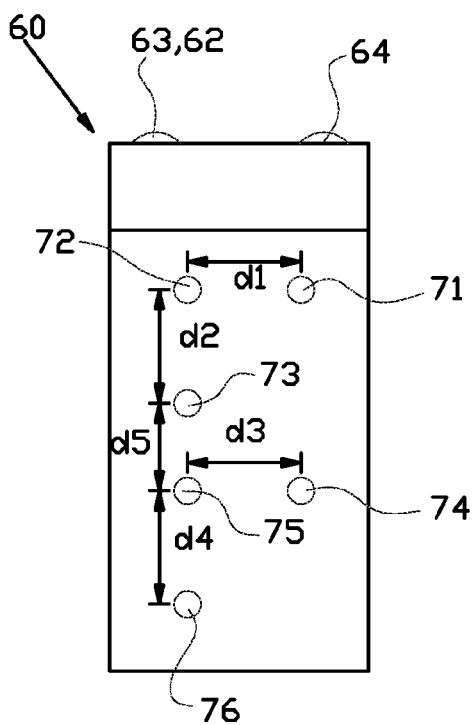
FIGS. 2A and 2B show a schematic side view and an isometric view respectively of a differential interferometer module according to the present invention, FIGS. 3A and 3B schematically show a perspective view and a top view respectively of a detail of an exposure tool and interferometer module according to the present invention.

FIG. 1A shows a lithography system 1 according to the present invention. The system comprises a frame 4, to which an optical column 36 having an optical axis 37 is mounted. The optical column is adapted for projecting a plurality of exposure beamlets 10 onto a target 7. By selectively switching selected exposure beamlets on or of, an exposure surface of the target below the optical column may be patterned. The target is placed on a wafer table 6, which in turn is placed on a chuck 66 which is moveable with respect to the optical column 36 by means of a stage 9 on which the chuck 66 is placed. In the embodiment shown, the chuck, wafer table and stage form a target carrier for moving the target 7 relative to the optical column 36.

The chuck 66 comprises a first mirror 21, comprising a substantially planar surface at substantially the same level or height within the system as the target 7 or exposure surface thereof. The optical column comprises a second mirror 81, which comprises a substantially planar surface close to the projection end of the optical column.

The system further comprises a modular interferometer head 60, or differential interferometer module, which is mounted to the frame 4 by means of a kinematic mount 62, 63, 64. The modular interferometer head 60 emits reference beams Rb onto the second mirror 81, and associated measurement beams Mb onto the first mirror 21. Though not shown in this figure, the reference beams comprise three reference beams, and the measurement beams comprise three measurement beams, and a relative movement between the first mirror 81 and second mirror 21 is measured by evaluating an interference between a reference beam and its associated measurement beam.

The three measurement beams Mb and the three reference beams Rb originate from a laser unit 31 which supplies a beam of coherent light, and which is coupled into the interferometer module 60 via an optical fiber 92 which forms part of a beam source for the module 60.

FIG. 1B schematically shows the lithography system 1 of FIG. 1A, wherein the lithography system comprises a vacuum housing 2. Within the vacuum housing 2, only the interferometer head 60 and its connections, and first 81 and second mirrors 21 are shown, though it will be understood that the target carrier of FIG. 1A will be contained within the vacuum chamber 2 as well.

The optical fiber 92 from laser 31 passes through a wall of said vacuum chamber 2 through a vacuum feed-through 91. Signals representative of interference between measurement beams and their associated reference beams are transported from the interferometer module 60 out of the vacuum chamber 2 via signal wires 54, which pass through vacuum feed-through 61.

FIG. 1C schematically shows a lithography system similar to the system shown in FIG. 1A, wherein the system is a charged particle beam lithography system comprising electron optics 3 for providing a plurality of charged particle beamlets, and wherein the projection optics 5 comprise a plurality of electrostatic lenses for individually focusing said charged particle beamlets onto an exposure surface of the target 7. The projection optics comprises actuators 67 for adjusting an orientation and/or position of the projection optics relative to the frame 4. The system further comprises a signal processing module 94 adapted providing a position and/or displacement signal to a stage control unit 95 for controlling movement of a stage 11. Signals are transmitted from the interferometer module 60 and the alignment sensor 57 via signal wires 54, 58 which pass through vacuum feed-throughs and 59, to the signal processing module 94, which processes these signals to provide a signal for actuating the stage 11 and/or the projection optics 5. The displacement of the wafer table 6, and thus of the target 7 supported thereby relative to projection optics 5 is thus continuously monitored and corrected.

In the embodiment shown, the wafer table 6 is supported by a moveable stage 11 via a kinematic mount 8, and the stage 9 may be moved relative to the projection optics 5 in a direction towards or away from the interferometer module 60. The differential interferometer module 60 emits three reference beams towards a mirror on the projection optics, and emits three measurement beams towards a mirror on the wafer table.

Figure 2B:
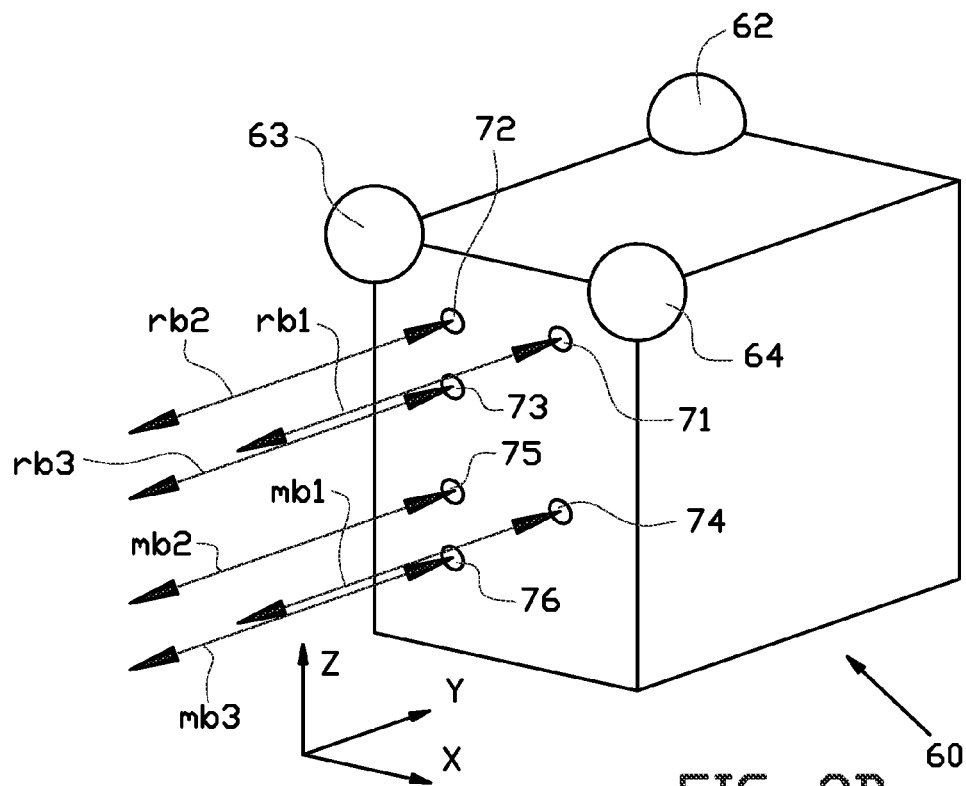

FIGS. 2A and 2B shows a front view and an isometric view respectively of the interferometer module of FIG. 1A. The interferometer module 60 comprises a kinematic mount 62, 63, 64 for easy and highly precise alignment of the module during mounting of the module on the frame. The interferometer module comprises three holes 71, 72, 73 for emitting three corresponding reference beams rb1, rb2, rb3, as well as for receiving reflections thereof back into the module. The interferometer module further comprises three holes 74, 75, 76 for emitting three corresponding measurement beams mb1, mb2, mb3, as well as for receiving reflections thereof back into the module. Hole 73 for emitting a reference beam is located at a distance d5 of 4 mm from hole 75 for emitting a measurement beam. Holes 71 and 72 are spaced apart by a distance d1, holes 72 and 73 by a distance d2, holes 74 and 75 by a distance d3 equal to distance d1, and holes 75 and 76 by a distance d4 equal to distance d2. In the embodiment shown the distances d1, d2, d3, d4 and d5 are center-to-center distances equal to 12, 5, 12, 5 and 4 millimeter respectively. In FIG. 2B in can be seen that the first reference beam rb1 and second reference beam rb2 span a first plane, and the second reference beam rb2 and third reference beam rb3 span a second plane, wherein the second plane is at an angle α (not shown) of 90 degrees with respect to the first plane. Likewise, the first measurement beam mb1 and second measurement beam mb2 span a third plane, and the second measurement beam mb2 and third measurement beam mb3 span a fourth plane, wherein the third plane is at substantially the same angle α (not shown) with respect to the fourth plane.

Figure 3A:
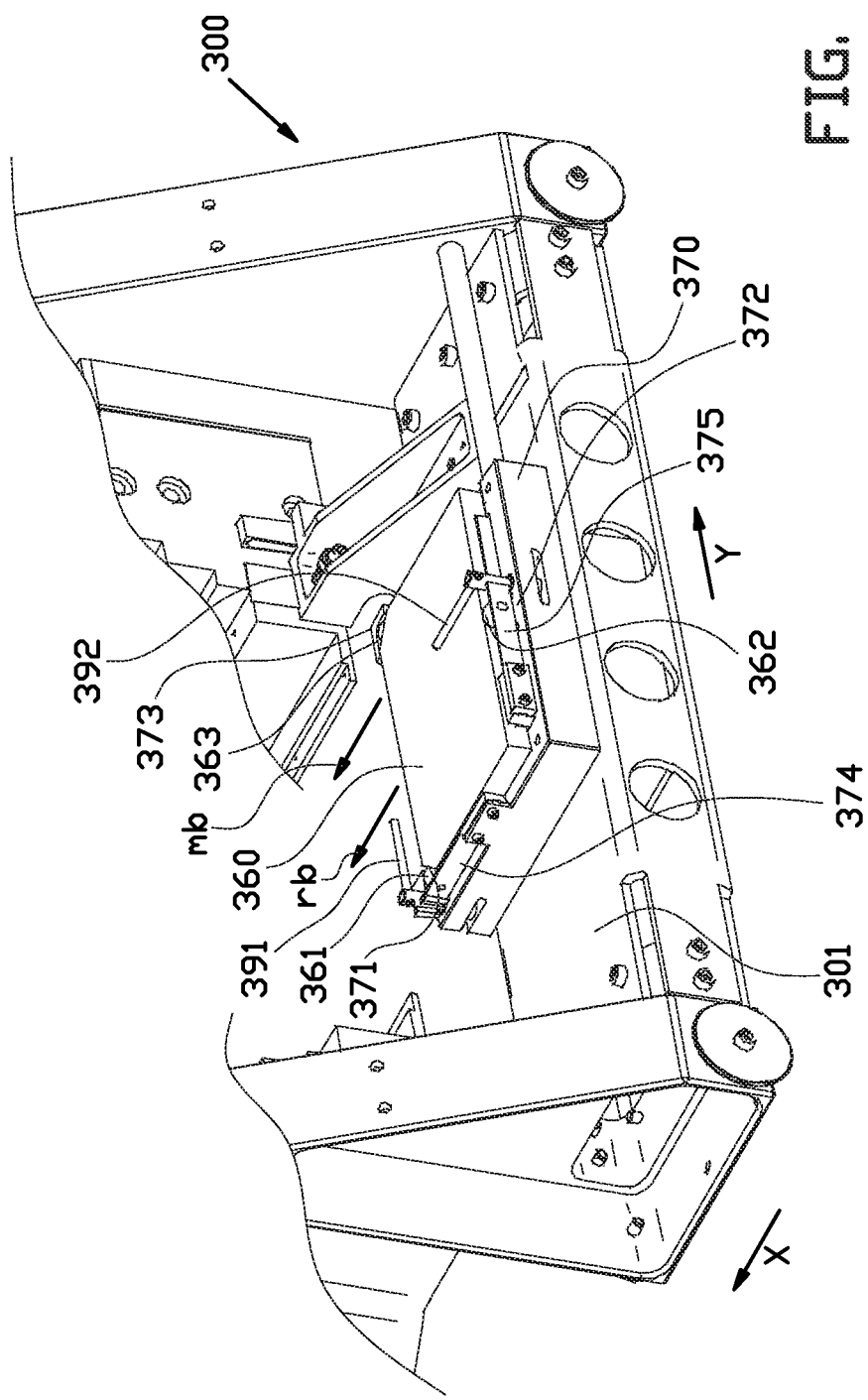

In order to facilitate replacement of an interferometer module in an exposure tool such as a lithography system, the present invention provides an exposure tool, a detail of which is shown in FIG. 3A. The tool 300 comprises projection optics and a target carrier for moving a target relative to the projection optics during exposure, similar to the lithography systems shown in FIGS. 1A, 1B and 1C. FIG. 3A shows a detail of an embodiment of such an exposure tool 300 for processing a target such as a wafer.

The interferometer module 360 is accommodated in an accommodation section 370 of the tool. Leaf springs 374, 375, which are biased to press second mounting surfaces 361, 362, 363 of the interferometer 360 against first mounting surfaces 371, 372, 373 respectively of the accommodating section 370 hold the module 360 in place in the accommodating section 370. The leaf springs 374, 375 form a quick-release clamp, for releasably clamping the interferometer module 360 in place in the accommodating section 370. As the springs bias the second mounting surfaces against the first mounting surfaces, a predetermined orientation of the second mounting surfaces relative to the first mounting surfaces is ensured. If the orientation of the interferometer module has been correctly pre-aligned relative to its second mounting surfaces, measurement beams mb and corresponding reference beam rb will be correctly aligned to respective measurement and reference mirrors of the exposure tool (not shown) as soon as the module is inserted in the accommodation section.

Figure 3B:
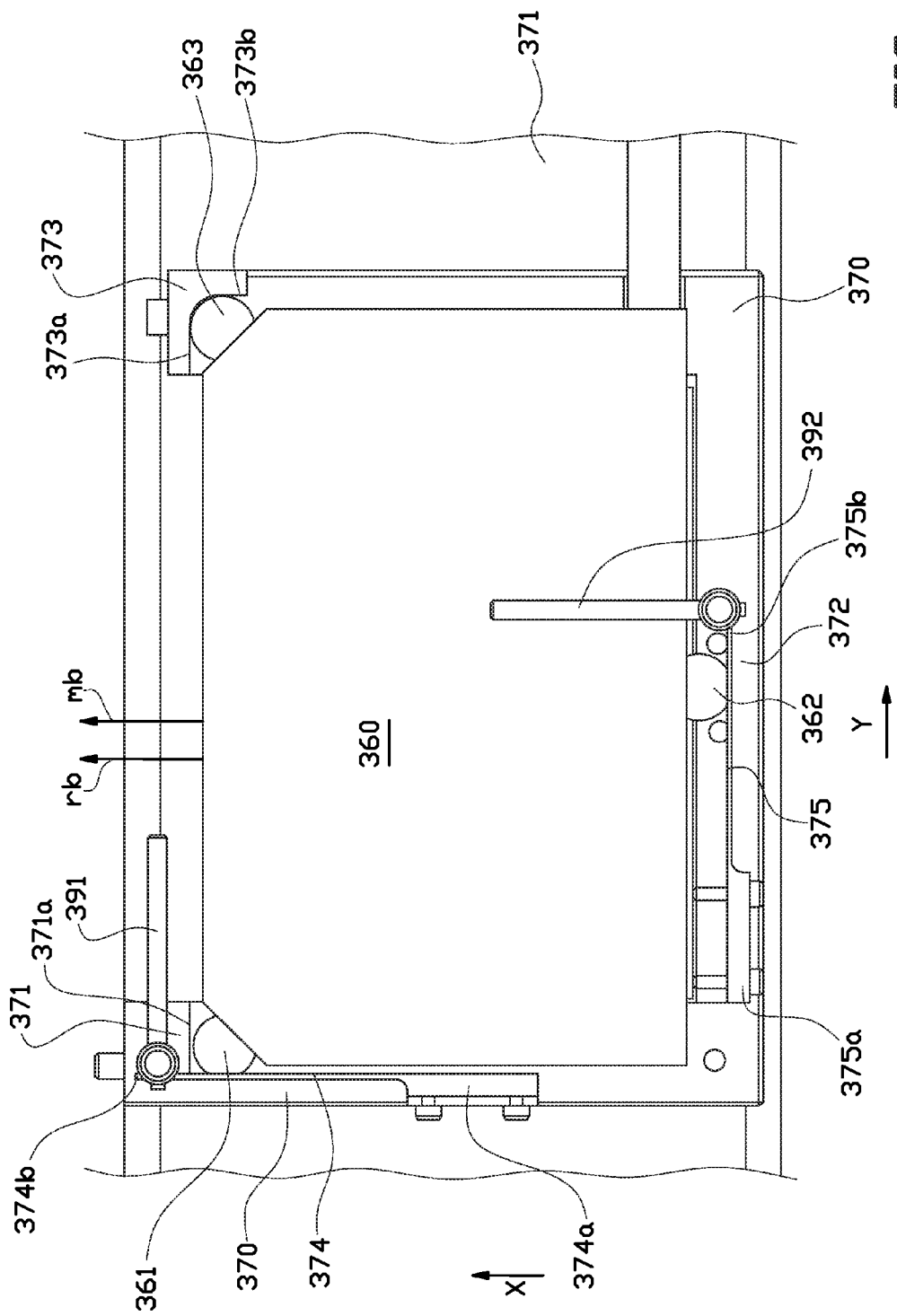

FIG. 3B shows a top view of the accommodation section 370 which is attached to frame 301, and of the module 360 installed in said accommodation section 370. Leaf spring 375 is adapted for exerting a force on the interferometer module 360 in direction X, against first abutment surfaces 371a, 373a of first mounting surfaces 371, 373, whereas leaf spring 374 is adapted for exerting a force on said module in direction Y, perpendicular to direction X, against second abutment surface 373b of first mounting surface 373.

Respective first ends 374a, 375a of leaf springs 374, 375 are fixedly attached to the accommodating section 370, whereas respective second ends 374b, 375b of said leaf springs are moveable relative to the accommodating section 370 by moving handles 391 or 392, which are attached to said respective second ends 374b, 375b of said leaf springs, away from respective second mounting surfaces 361 and 362 of the interferometer module 360. When neither leaf spring 374, 375 presses first mounting surface 361 or 362 against corresponding second mounting surface 371 or 372, the module may easily be removed from the accommodating section 370. During insertion of an interferometer module 360, for instance a replacement module, into the accommodation section 370, the leaf springs 374, 375 are held spaced apart from second mounting surfaces 361, 362, 363 of the module. Once the module 360 has been inserted in the accommodating section 370, the two leaf springs 371, 372 are released to clamp second mounting surfaces 361, 362, 363 against the corresponding first mounting surfaces in a predetermined orientation.

FIGS. 4A and 4B show a top view and a side view of an exposure tool, or lithography system, according to the present invention, in which a first and a second differential interferometer module 60A, 60B as described herein are arranged for measuring a displacement of the wafer 7 relative to projection optics 5. The projection optics is provided with two planar mirrors 81A, 81B, arranged at a 90 degrees angle with respect to each other. The wafer 7 is supported by a wafer table 6 which comprises two planar mirrors 21A and 21B arranged at a 90 degrees angle with respect to each other as well. The first differential interferometer module 60A emits three reference beams rb1, rb2, rb3 on mirror 81A of the projection optics, and emits three measurement beams on mirror 21A of the wafer table. Similarly, the second differential interferometer module 60B emits reference beams on mirror 81B of the projection optics, and emits measurement beams on mirror 21B of the wafer table.

Though the interferometer heads 60a, 60b according to the invention may be aligned relative to the corresponding mirrors 81a, 81b while said modules are outside of the lithography system, it is desirable that both interferometers are also aligned to each other.

FIG. 5A shows an interferometer module 500, comprising an L-shaped housing 501 having a first leg 502 and a second leg 503. The legs 502, 503 are rigidly connected to each other at corner section 504. Though in the embodiment shown, the legs are comprised of a light weight and rigid material, in other embodiments the legs may be formed as substantially hollow structures, for instance comprising a honey-comb structure to provide a rigid and light weight structure. The interferometer module comprises a first interferometer head 510 as described herein, attached to said first leg, and a second interferometer head 530 as described herein, attached to said second leg. The first and second interferometer heads 510, 530 are adjustably connected to the legs 502, 503 by adjustment plates 520, 521, 523, and 540, 541 and 542 respectively. When the module is outside of the exposure tool, the first and second interferometer head 510, 530 can be aligned with each other such that they emit beams perpendicularly, and/or at a same level, such that beams emitted by the first interferometer head may intersect beams emitted by the second interferometer head. Highly precise alignment of two interferometer heads for use in an exposure tool is thus achieved without requiring access to said tool.

At corner sections at the distal ends of the arms 502, 503 of the L-shaped housing 501, said housing is provided with second mounting surfaces in the form of kinematic balls 561, 562, 563 for cooperative engagement with first mountings surfaces of an exposure tool (see FIGS. 6A-6C and 7A-7C). At the same corner sections y, the interferometer is provided with sockets 581, 582, 583 for accommodating a tension spring mount of the exposure tool. Thus, a spring mount is used to press the kinematic balls 561, 562, 563 against corresponding first mounting surfaces of the exposure tool. When pressed against each other, the kinematic balls 561, 562, 563 and the first mounting surfaces assume a predetermined position, such that a module which had been pre-aligned outside of the exposure tool may be installed in the exposure tool, after which it is immediately aligned with the rest of the system.

Figure 5B:
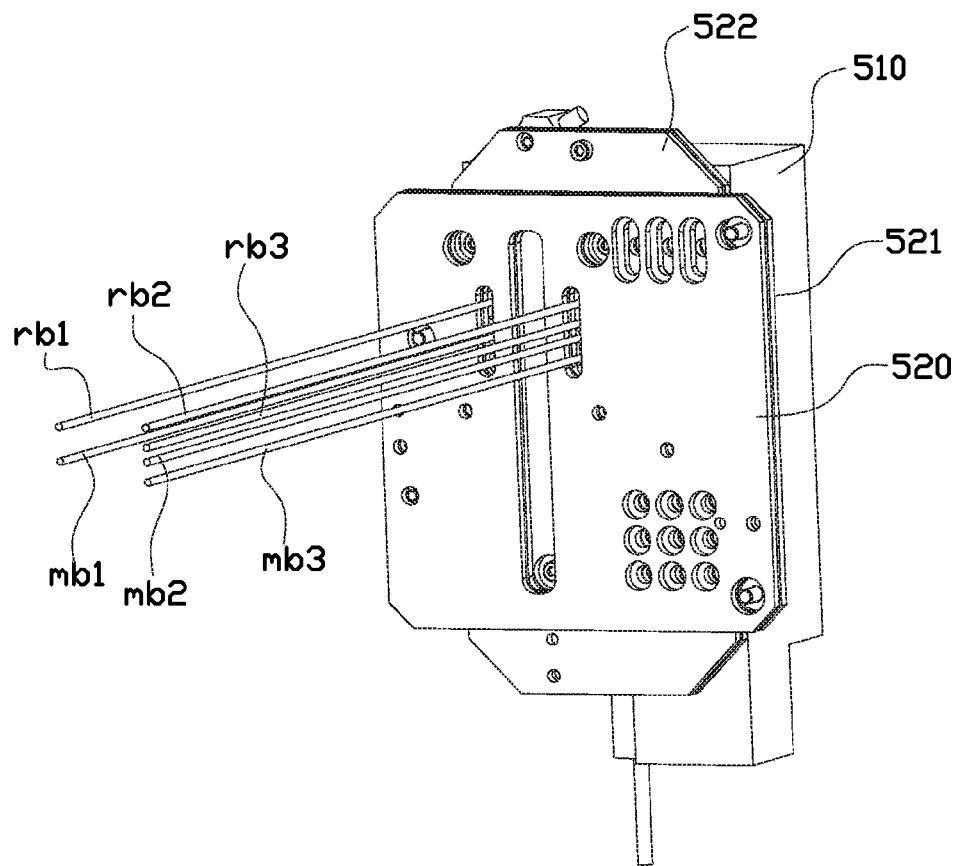

FIG. 5B shows a detail of interferometer head 510 and adjustment plates 520, 521, 522 of FIG. 5A. The interferometer head is a differential interferometer head adapted for emitting three measurement beams mb1, mb2, mb3 and three corresponding reference beams rb1, rb2, rb3. The adjustment plate 522 is fixedly attached to the legs 502. Together with adjustment plates 520 and 521, adjustment plate 522 forms adjustment means, in which the orientation of the plates relative to each other may be adjusted.

Figure 6A:
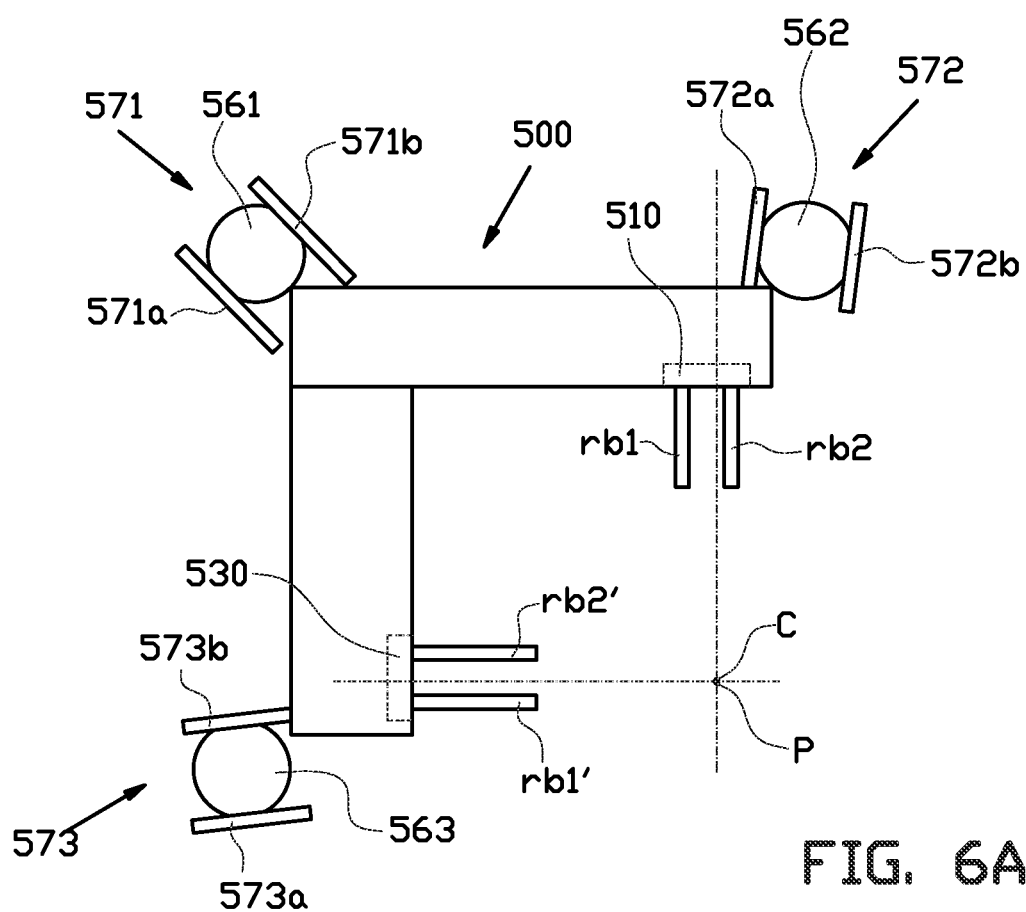
FIGS. 6A, 6B and 6C show configurations of the first mounting surfaces and the second mounting surfaces of an exposure tool according to the present invention.
Figure 6B:
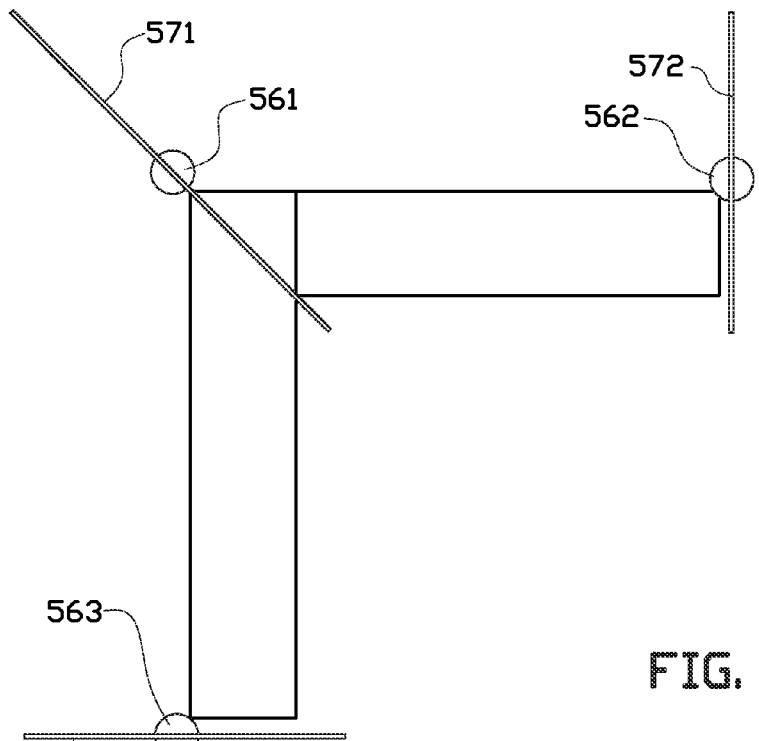
Figure 6C:
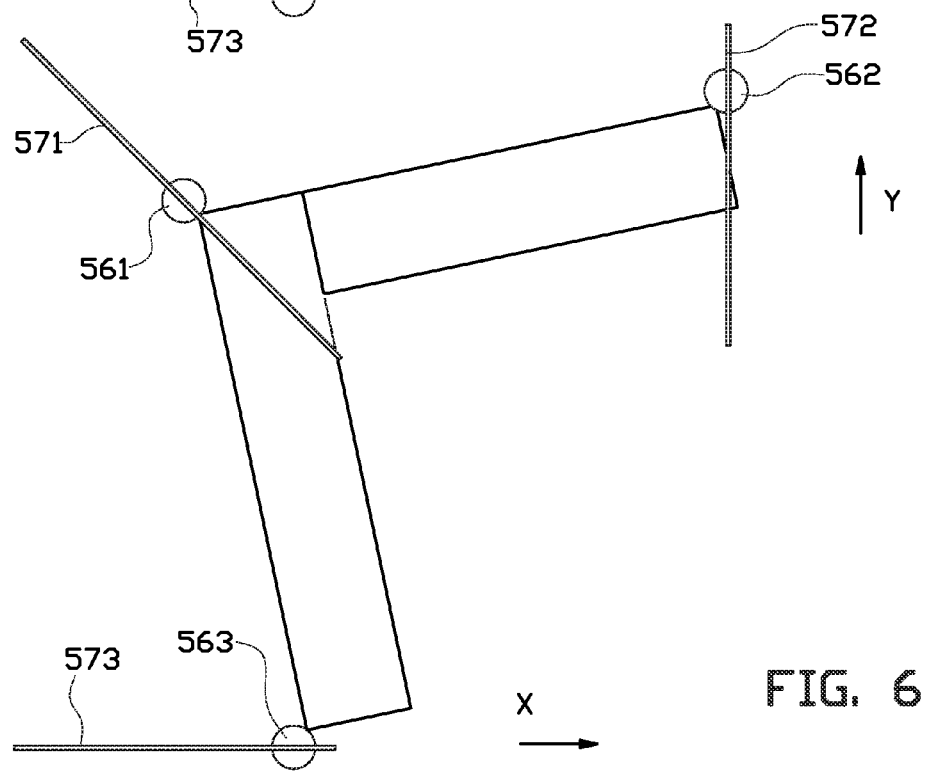

FIG. 6A schematically shows a bottom view bottom of first mounting surfaces in the form of grooves 571, 572, 573. Also shown is the dual interferometer module comprising first interferometer head 510, emitting reference beams rb1, rb2, and second interferometer head 530 emitting reference beams rb1', rb2'. The kinematic balls of 561, 562, 563 of the interferometer module fit in the respective straight grooves 571, 572, 573. The grooves 571, 572, 573, which form planar abutment surfaces, are space apart from each other and have sides 571a, 571b, 572a, 572b and 573a, 573b respectively. Point P is for instance a point close to mirrors attached to a projection lens of an exposure tool in which the module is used. The thermal center of the kinematic mount formed by the kinematic balls and the grooves is close to said point P. Likewise, in FIG. 6B, the grooves 573 and 572 are oriented at an angle of substantially 45 degrees to groove 571. However, as can be seen in FIG. 6C, this orientation of the grooves allows rotation of the module around an axis Z perpendicular to axes X and Y. As a result, the beams displacements measured by the interferometer heads of the module will contain errors.

In FIG. 7A the planes in which the grooves 571, 572, 573 lie intersect at a position C having a distance to said projection optics P which is substantially greater than a distance of each of said interferometer heads 510, 530 to said projection optics along the direction of the respective beams rb1, rb2 and rb1' and rb2' emitted by said interferometer head. As a result, the configurations of first mounting surfaces 571, 572, 573 and second mounting surfaces 561, 562, 563 shown in FIG. 7A restrain rotation around of the interferometer module. The angle between the directions of grooves 572 and 572 to groove 571 is substantially equal to 120 degrees.

In FIG. 7B, the planes in which the grooves lie intersect at point C which substantially coincides with kinematic ball 561 when seen in top view. In this configuration, two grooves 571, 572 are substantially parallel to each other, while the other groove 573 is perpendicular thereto. This configuration too restrains rotation of the interferometer module.

In FIG. 7C, the kinematic balls lie against planar abutment surfaces 574, 575, 576. When the kinematic balls 561, 562, 563 of the module are clamped against these abutment surfaces, rotation of the module is restrained as well.

Figure 8A:
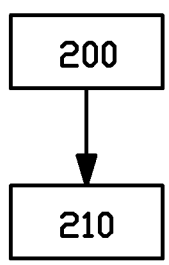
FIGS. 8A and 8B show flow charts of methods for pre-aligning an interferometer for use in an exposure tool, according to the invention.
Figure 8B:
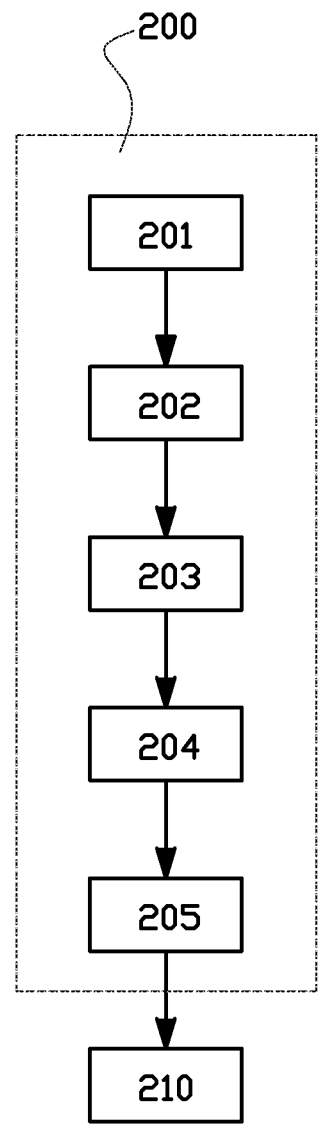

FIG. 8A shows a flow chart of a method according to the invention, for pre-aligning an interferometer module for use in an exposure tool comprising a frame provided with first mounting surfaces and a mirror for reflecting an interferometer beam, wherein said module comprises an interferometer head for emitting an interferometer beam, and wherein said module is connected to second mounting surfaces for cooperative engagement with said first mounting surfaces. The method may for instance be performed using an exposure tool an interferometer module therefor, as described herein. The method comprises a step 200 of aligning the orientation of said module relative to said second mounting surfaces outside of said exposure tool, wherein said orientation of said module relative to said second mounting surfaces is aligned based on a pre-determined orientation of said first mounting surface relative to said mirror. Optionally the method may comprise the further step 210 of mounting the aligned module in an exposure tool. Because the interferometer module is aligned outside of the exposure tool, the exposure tool may remain in production mode during said alignment procedure, reducing downtime of the exposure tool. After step 210 the exposure tool may immediately be used for exposure purposes, without additional alignment or calibration of the interferometer module. In other words, the present invention provides a method for pre-aligning a replacement interferometer module for an exposure tool during operation of said exposure tool.

FIG. 2B shows an embodiment of the present method in which step 200 comprises substeps 201-205. In step 201 an alignment frame is provided comprising third mounting surfaces for cooperative with said second mounting surfaces, and a sensor for sensing a position of a beam emitted by the interferometer head. The alignment frame is provided at a location spaced apart from the exposure tool. In step 202, the interferometer module is mounted with the second mounting surfaces on the third mounting surfaces of the alignment frame. The position of the second mounting surfaces relative to the alignment frame is then known. In step 203 a beam is emitted by said interferometer head. The sensor senses in step 204 whether said beam is emitted to a pre-determined position. This may be done for instance using a sensor for measuring energy or intensity of a beam incident thereon, and a knife-edge arranged between said sensor and the interferometer head. The knife-edge is arranged at a known position relative to the third mounting surfaces, for blocking substantially 50% of a beam when said beam is emitted to said pre-determined position. To determine whether a beam is at a predetermined position, the orientation of the interferometer head is first adjusted such that the beam is completely incident on said sensor, such that the sensor measures the total energy or intensity of said beam. Next, the orientation of the interferometer head is adjusted such that the beam is partially blocked by the knife edge until 50% of the total beam energy or intensity is measured by the sensor, which indicates that the beam is at the predetermined position and thus properly aligned. In case the interferometer module comprises further interferometer heads, steps 203 and 204 are performed for said further interferometer heads as well. Optionally, when the module comprises further interferometer heads, a step 205 may be performed, in which the beams emitted by said interferometer head and/or said further interferometer heads are aligned with each other. For instance, when the module comprises two interferometer heads adapted for emitting beams at an intended angle of 90 degrees to each other, the orientations of the interferometer heads may be adjusted such that they indeed emit beams at 90 degrees to each other, and/or the orientations of the two interferometer heads may be adjusted such that they are arranged for emitting beams which intersect. Once the module has been aligned, it is mounted in the exposure tool in step 210.

Figure 9A:
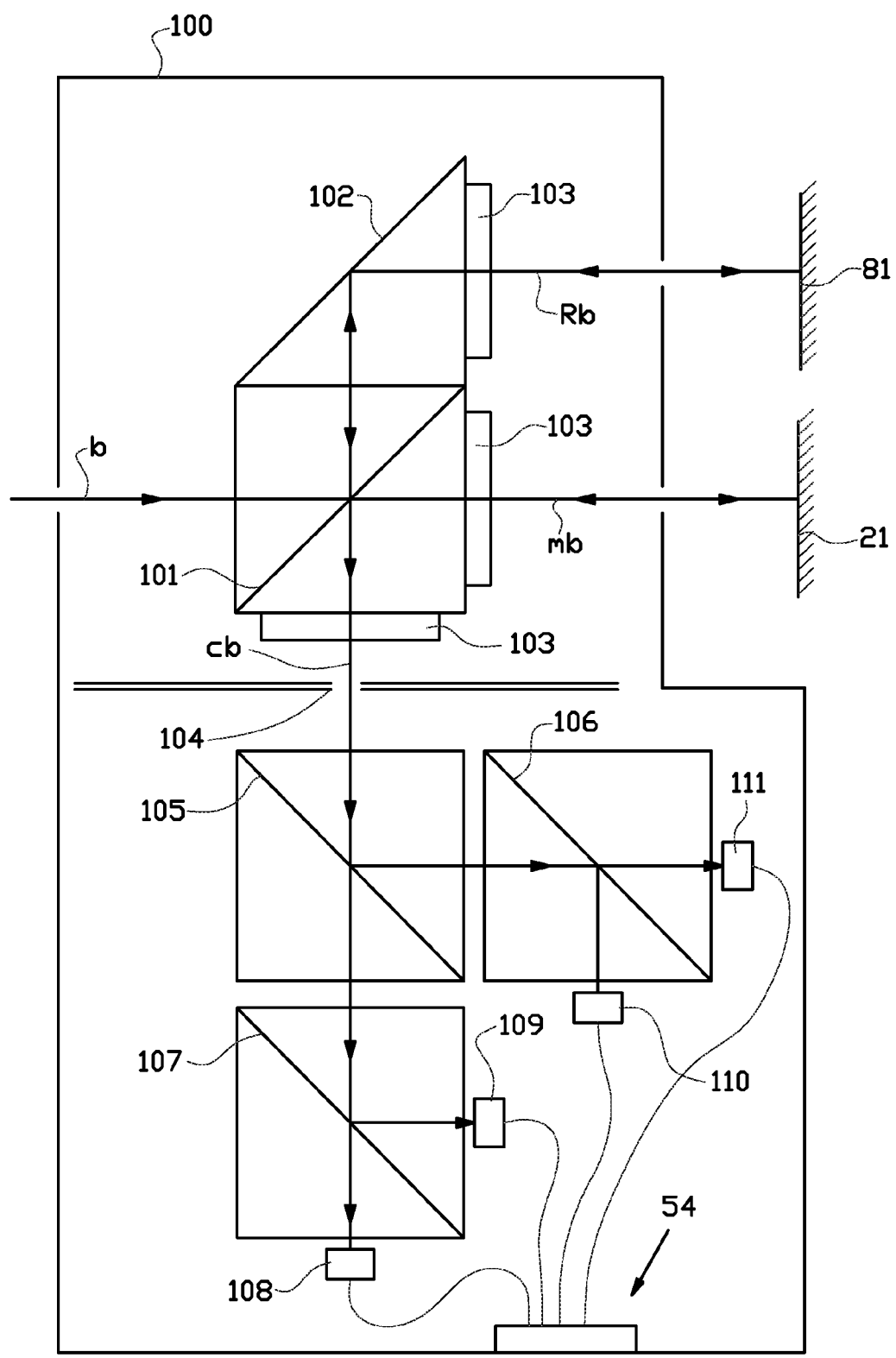
FIG. 9A shows a detail of a beam splitter and a combined beam receiving as used in a differential interferometer according to the invention.

FIG. 9A shows a detail of a preferred embodiment of an interferometer head 100 according to the present invention. A single coherent beam b is emitted onto polarizing beam splitter 101, which splits the beam b into a polarized measurement beam Mb and an associated polarized reference beam Rb. After having passed the polarizing beam splitter 101, the measurement beam Mb passes a quarter wave plate 103. The incident measurement beam is then reflected back by first mirror 21, and again passes the quarter wave plate 103. Subsequently the reflected measurement beam is reflected through an iris 104 by the polarizing beam splitter 101.

Similarly, the part of the coherent beam that forms the reference beam Rb is reflected by prism 102 through a quarter wave plate 103 and incident on second mirror 81. The reference beam Rb is then reflected back by mirror 81 and again passes through the same quarter wave plate 103, after which it is reflected by prism 102, through polarizing beam splitter 101 towards iris 104.

Thus, when the interferometer is active, a combined beam Cb passes the iris 104. A non-polarizing beam splitter 105 splits the combined beam up into two, wherein the two combined beam portions into which the combined beam is split up comprise both a portion of the reflected reference beam and a portion of the reflected measurement beam. The two beam portions in turn are split up by polarizing beam splitters 106 and 107 respectively. The polarizing beam splitter 106 is rotated 45 degrees with respect to polarizing beam splitter 107. Thus four distinct combined beam portions result, having a parallel polarization, a perpendicular polarization, a 45 degree polarization and a 135 degree polarization respectively. Detectors 108, 109, 110 and 111, convert intensities of these four combined beam portions into a first signal sig1, a second signal sig2, a third signal sig3 and a fourth signal sig4 respectively.

Figure 9B:
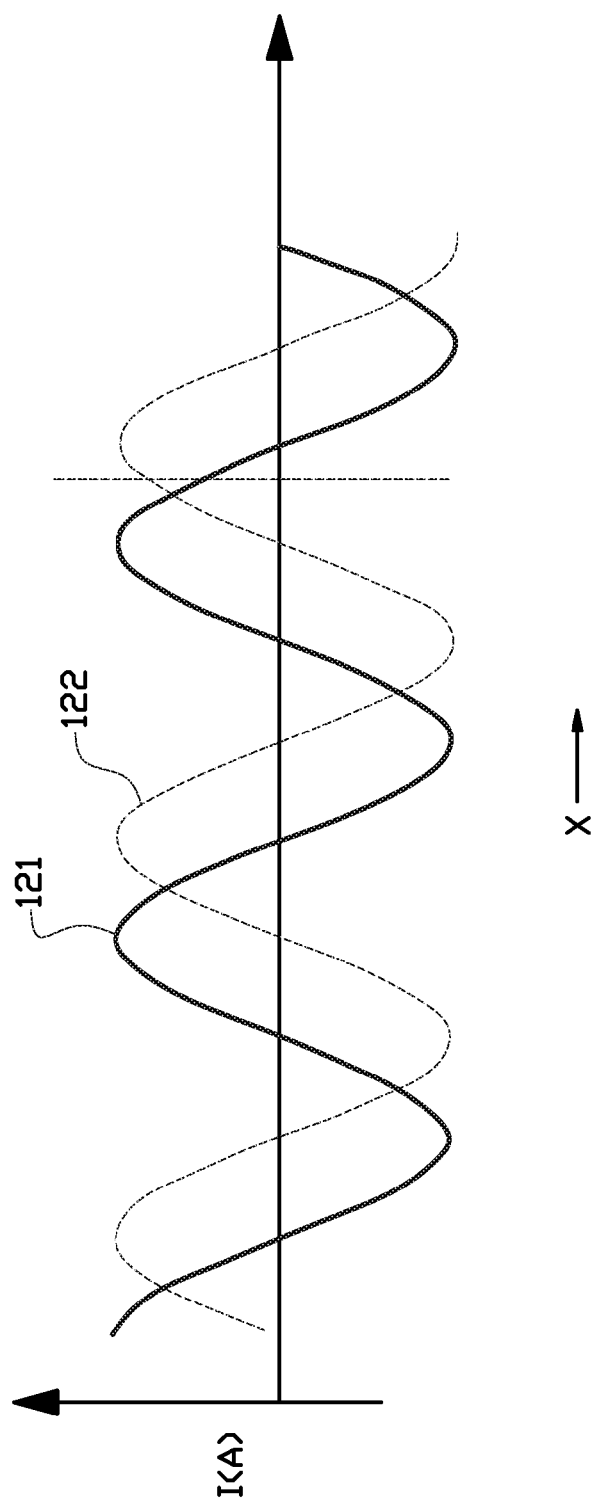
FIG. 9B shows a graph of signals obtained using a differential interferometer of FIG. 4A.

FIG. 9B shows a graph of a difference between said signals sig1 and sig2, and of a difference between said signals sig3 and sig4 as a wafer table, or target carrier, is moved at a constant velocity with respect to the projection optics. The graph shows two sinusoidal curves 121, 122 that are used to determine a wafer table displacement and thus the wafer table position.

When only a single sinusoid curve is available, it may be difficult to determine a direction of relative movement when a change in intensity from a peak level to a lower level occurs, as both movement of the wafer table towards and away from the optical column will result in a lower intensity signal. According to the present invention, a direction of movement can be determined at any time by using two sinusoid curves that are out of phase with respect to each other, for instance out of phase by 45 degrees. A further advantage of using two curves instead of one is that measurements may be carried out more accurately. For instance, when a peak is measured for curve 121, a small movement to either side will result in a small change in measured intensity signal of the curve. However, the same small movement results in a large change in measured intensity signal of curve 122, which may then be used to determine the displacement instead.

Figure 9C:
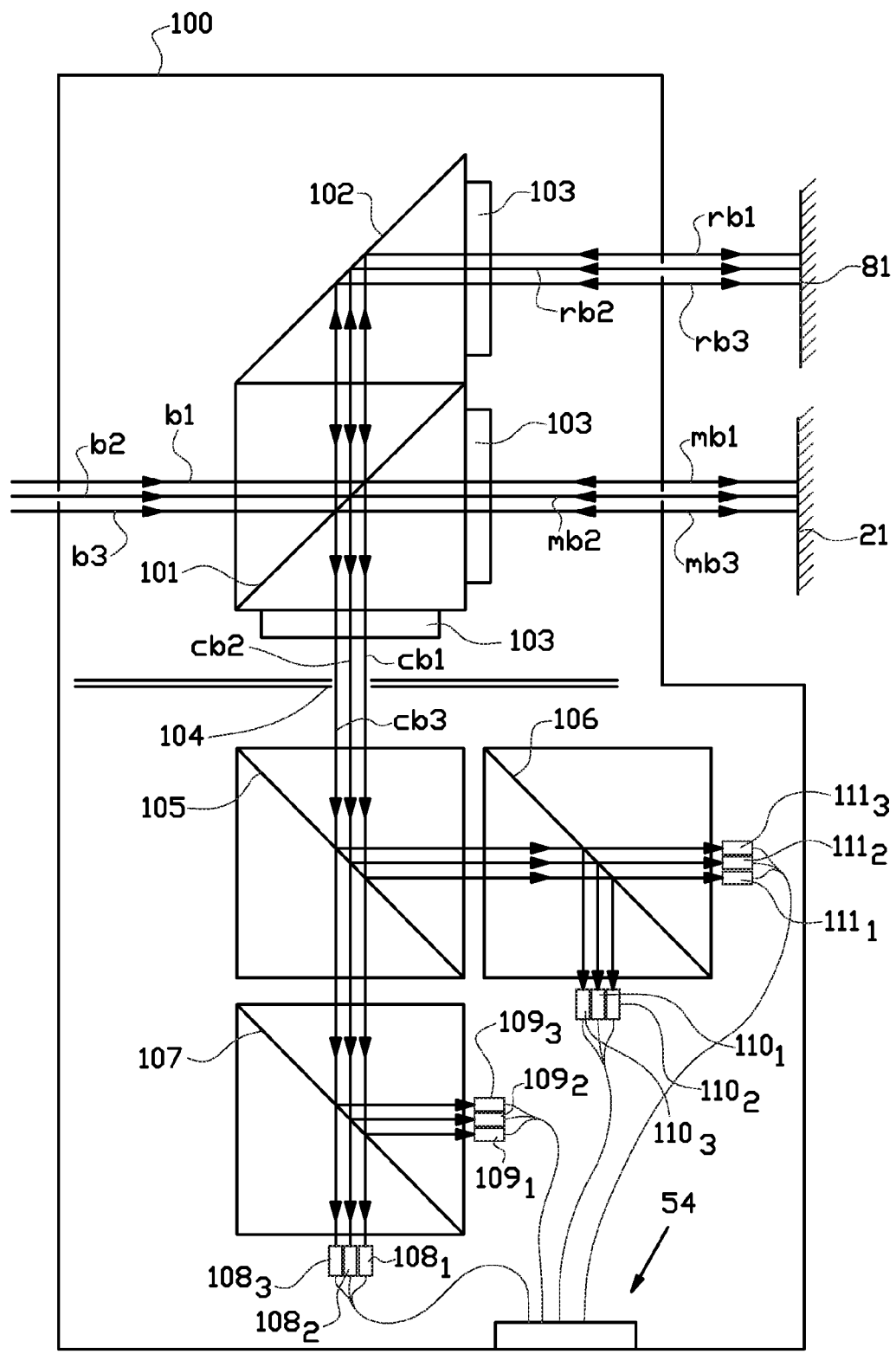
FIG. 9C shows a graph of signals obtained using a further embodiment of a differential interferometer according to the present invention, FIG. 10 schematically shows an alignment frame according to the invention.

FIG. 9C schematically shows an interferometer head according to the invention similar to the embodiment shown in FIG. 4A, however wherein three coherent light beams b1, b2, b3 are incident on polarizing beam splitter 101 instead of only one. This results in three reference beams rb1, rb2, rb3 being emitted towards the second mirror 81, and three measurement beams being emitted towards the first mirror 21. The three reference beams and associated three measurement beams are emitted from a beam source as described above, preferably non-coplanarly.

The three reflected reference beams and associated three reflected measurement beams are combined into three combined beams which pass the iris 104 and are split up in the same manner as described above. Beam receiving intensity detectors 108$_1$, 108$_2$, 108$_3$ detect an interference of a portion of each of the combined beams cb1, cb2, cb3 respectively. Detectors 109$_1$, 109$_2$, 109$_3$, 110$_1$, 110$_2$, 110$_3$, 111$_1$, 111$_2$, 111$_3$ function likewise for combined beam portions with different polarizations, resulting in a total of 12 detection signals. From these detection signals sinusoidal curves can be constructed which provide information on relative displacement and rotation of the two mirrors 81, 21.

Figure 10:
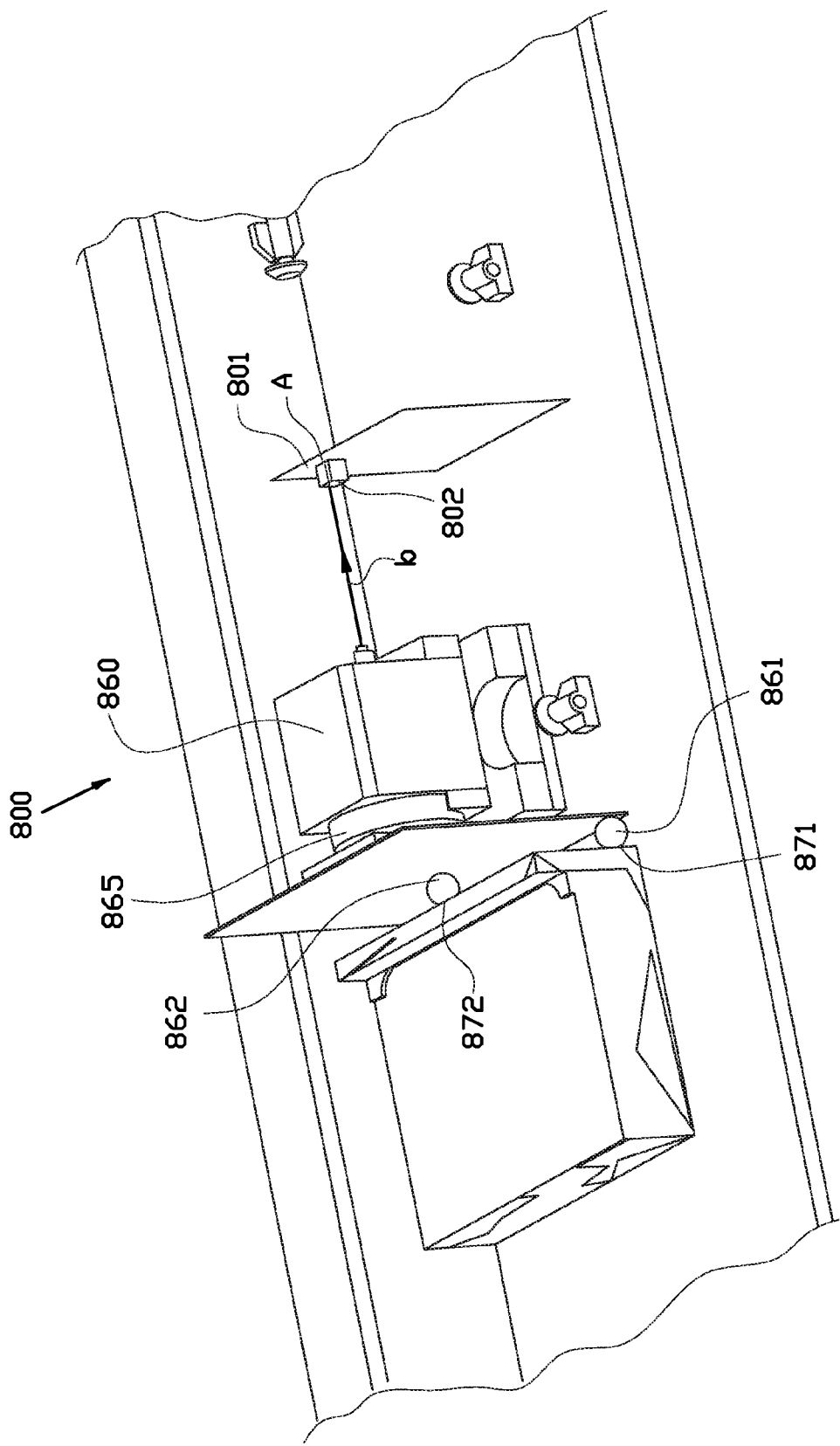

FIG. 10 schematically shows an alignment frame 800 according to the invention. The alignment frame is suitable to perform alignment of an interferometer module for use in an exposure tool, while the interferometer module is outside of said tool. To this end the frame 800 comprises third mounting surfaces 871, 872, for cooperating engagement with second mounting surfaces 861, 862 of said module. Though only two of the third mounting surfaces and two of the second mounting surfaces are shown, it will be obvious that the frame typically comprises three such third mounting surfaces in total, and the module typically comprises three such second mounting surfaces. The module comprises adjustment means 865 for adjusting a position and/or orientation of the module 860 relative to the second mountings surfaces 861, 862. When the module is mounted on the frame, as shown in FIG. 10, it is switched on to emit a beam b towards a beam sensor 801, in the form of a light detector. The beam is scanned over said sensor from a position in which all of the beam energy is sensed by said sensor 801, to a position in which substantially half of said beam energy is blocked from reaching the sensor by knife edge 802 which is arranged between the sensor and the interferometer module 860. The knife edge 802 is arranged in an orientation relative to the third mounting 871, 872 surfaces corresponding to a pre-determined orientation of the first mounting surfaces in the exposure tool relative to a mirror onto which the interferometer 860 is to emit is beam(s) when mounted in said tool. Thus, when the beam sensor 801 detects substantially 50% of the beam energy, it is determined that the beam is aligned at a pre-determined position A.

In summary the present invention relates to a lithography system comprising an optical column, a moveable target carrier for displacing a target such as a wafer, and a differential interferometer module, wherein the interferometer module is adapted for emitting three reference beams towards a second mirror and three measurement beams towards a first mirror for determining a displacement between said first and second mirror. In an embodiment the same module is adapted for measuring a relative rotation around two perpendicular axes as well.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Method of pre-aligning an L-shaped interferometer module for use in an exposure tool comprising a frame provided with first mounting surfaces and a mirror for reflecting an interferometer beam, wherein said interferometer module comprises an interferometer head for emitting an interferometer beam and a further interferometer head for emitting a further beam perpendicular to said interferometer beam, wherein said first and second interferometer head are arranged on different legs of said L-shaped interferometer module for emitting their respective interferometer beam towards each other, wherein said module is connected to second mounting surfaces for cooperative engagement with said first mounting surfaces, said method comprising the steps of:

aligning the orientation of said module relative to said second mounting surfaces outside of said exposure tool, wherein said orientation of said module relative to said second mounting surfaces is aligned based on a pre-determined orientation of said first mounting surfaces relative to said mirror, wherein said predetermined orientation comprises an angular orientation and a positional orientation of said first mounting surfaces relative to said mirror;

aligning the orientation of said further interferometer head relative to said second mounting surfaces outside of said exposure tool based on said pre-determined orientation of said first mounting surfaces relative to said mirror, wherein the orientations of said interferometer head and said further interferometer head are adjusted such that said beams emitted by said interferometer head and said further interferometer head are inclined at a pre-determined angle of 90 degrees to each other.

2. Method according to claim 1, further comprising a step of mounting said aligned module in said exposure tool.

3. Method according to claim 2, wherein after said step of mounting said aligned interferometer module in said exposure tool, said exposure tool is used for exposure purposes without additional alignment or calibration of the interferometer module.

4. Method according to claim 1, wherein said step of aligning comprises:
providing an alignment frame spaced apart from said exposure tool and comprising third mounting surfaces for cooperative engagement with said second mounting surfaces, and a sensor for sensing whether a beam emitted by said interferometer head is emitted to a pre-determined position,
mounting said module with said second mounting surfaces on said third mounting surfaces of said alignment frame, emitting a beam with said interferometer head, and
adjusting the orientation of said module relative to said second mounting surfaces to position said beam on said pre-determined position.

5. Method according to claim 4, further comprising using a knife-edge arranged for partially blocking said beam from reaching said sensor when said module is mounted in said alignment frame, wherein said step of adjusting comprises determining that said beam is in said predetermined position when the energy of said beam sensed by said sensor is equal to a predetermined fraction of a total beam energy of said beam.

6. Method according to claim 4, wherein said interferometer is a differential interferometer adapted for emitting said beam as a measurement beam and for emitting a corresponding reference beam, wherein said alignment frame comprises an sensor for sensing the position of said reference beam, said method comprising adjusting the orientation of said module relative to the direction into which said measurement and reference beams are emitted such that the sum of energy of said beams sensed by said beam sensing surfaces is equal to a predetermined fraction of a total beam energy of said beams.

7. Method according to claim 5 or claim 6, wherein said predetermined fraction is 50%.

8. Method according to claim 1, wherein said first mounting surfaces of said exposure tool and/or said third mounting surfaces of said alignment frame are adapted for forming a kinematic mount with said second mounting surfaces of said interferometer module.

9. Method according to claim 1 or claim 2, wherein said aligning comprises aligning said beam and said further beam such that they intersect.

10. Method according to claim 9, wherein, when the interferometer module is outside of the exposure tool, the first interferometer head and the further interferometer head are aligned with each other such that they emit beams perpendicularly, and/or at a same level, such that beams emitted by the interferometer head may intersect beams emitted by the further interferometer head.

11. Method according to claim 1 or claim 2, wherein said exposure tool further comprises releasable clamping means for releasably clamping said second mounting surfaces of said interferometer module against said first mounting surfaces.

12. Method according to claim 11, wherein said releasable clamping means comprises a leaf-spring adapted for biasing said second mounting surfaces against said first mounting surfaces.

13. Method according to claim 1 or claim 2, wherein said exposure tool comprises an accommodating section for receiving said interferometer module, wherein said accommodating section comprises said first mounting surfaces.

14. Method according to claim 13, wherein said accommodating section comprises a wall provided with a passage for allowing a beam emitted by said interferometer to pass through.

15. Method according to claim 1, wherein said second mounting surfaces are arranged at corners of said L-shaped module.

16. An interferometer module comprising:
second mounting surfaces for cooperative engagement with first mounting surfaces of an exposure tool;
a first interferometer head for emitting a first interferometer beam;
a first adjustment means for adjusting an orientation of said first interferometer head relative to said second mounting surfaces;
a second interferometer head arranged for emitting a further interferometer beam perpendicular to said first interferometer beam emitted by said first interferometer head;
a second adjustment means for adjusting an orientation of said second interferometer head relative to said second mounting surfaces;
wherein said interferometer module is L-shaped, with said first and second interferometer head each arranged on different legs of said L-shaped interferometer module for emitting their respective interferometer beam toward each other.

17. The interferometer module according to claim 16, wherein said second mounting surfaces are arranged at corners of said L-shaped module.

18. The interferometer module according to claim 16, wherein said adjustment means and/or said second adjustment means comprise a number of adjustment plates.

* * * * *